United States Patent [19]
Hanke et al.

[11] Patent Number: 5,396,174
[45] Date of Patent: Mar. 7, 1995

[54] ANTENNA ARRANGEMENT WITH SHIELDING FOR A NUCLEAR MAGNETIC RESONANCE TOMOGRAPHY APPARATUS

[75] Inventors: Wilhelm Hanke, Rueckersdorf; Michael Morita, Mistelgau; Ludger Freisen, deceased, late of Erlangen, all of Germany, by Brigitte Freisen, heir

[73] Assignee: Siemens Aktiengesellschaft, Munich, Germany

[21] Appl. No.: 174,408

[22] Filed: Dec. 28, 1993

[30] Foreign Application Priority Data

Jan. 21, 1993 [DE] Germany .......... 43 01 557.3

[51] Int. Cl.⁶ .......................................... G01R 33/20
[52] U.S. Cl. .......................................... 324/318
[58] Field of Search ............... 324/300, 307, 309, 318, 324/322; 128/653.2, 653.5

[56] References Cited

U.S. PATENT DOCUMENTS

| | | | |
|---|---|---|---|
| 4,680,550 | 7/1987 | Krause | 324/318 |
| 4,712,408 | 12/1987 | Roschmann et al. | 324/322 |
| 4,766,383 | 8/1988 | Fox et al. | 324/318 |
| 4,876,510 | 10/1989 | Siebold et al. | 324/318 |
| 4,878,022 | 10/1989 | Carlson | 324/318 |
| 4,939,465 | 7/1990 | Biehl et al. | 324/318 |
| 5,200,703 | 4/1993 | Popp et al. | 324/322 |

FOREIGN PATENT DOCUMENTS

| | | |
|---|---|---|
| 0105550 | 9/1983 | European Pat. Off. . |
| 0171741 | 8/1985 | European Pat. Off. . |
| 0257782 | 7/1987 | European Pat. Off. . |
| 3515190 | 11/1986 | Germany . |

*Primary Examiner*—Michael J. Tokar
*Attorney, Agent, or Firm*—Hill, Steadman & Simpson

[57] ABSTRACT

The conductor structures of an antenna in a nuclear magnetic resonance tomography apparatus are covered with lamellae that extend in longitudinal direction of the examination space and have large-area connections at the end sides of the antenna to a shielding that surrounds the examination space. In an alternative embodiment, the lamellae extend the azimuthal direction and are connected to a shielding (3) surrounding the examination space at the respective longitudinal edges of the conductor structure of the antenna via broad-web, planar conductors with a free cross section remaining between the conductors.

5 Claims, 5 Drawing Sheets

ANTENNA ARRANGEMENT WITH SHIELDING FOR A NUCLEAR MAGNETIC RESONANCE TOMOGRAPHY APPARATUS

BACKGROUND OF THE INVENTION

1. Field of the Invention

The present invention is directed to an antenna arrangement with shielding for a nuclear magnetic resonance tomograph apparatus, and in particular to an antenna arrangement of the type wherein the antenna is composed of planar conductor structures arranged at the circumference of an examination space and extending in the longitudinal direction thereof, antenna being partially covered with shielding elements that are connected to a shielding that surrounds the examination space.

2. Description of the Prior Art

An antenna arrangement of the above type is disclosed in European Application 0 105 550. The antenna disclosed therein is composed of two radio-frequency coils extending in the longitudinal direction of the examination space. The interspace between the conductors of the radio-frequency coils proceeding in the longitudinal direction of the examination space is bridged with a comb-like structure of conductive elements. The electrical field around the conductor is thus shielded, so that a fixed stray capacitance between the conductors and the comb-shaped structure is achieved in addition to a higher Q-factor for the radio-frequency coil. This stray capacitance is minimally influenced by the geometry or nature of an examination subject. The necessity of balancing the radio-frequency circuit dependent on the examination subject is thus eliminated.

In the comb structure of European Application 0 105 550, all individual elements are connected to one another at one side and are grounded outside the radio-frequency coil. This, however, has the disadvantage that there are relatively long conductor paths are necessary—particularly for the middle elements of the comb structure—having a not inconsiderable inductance to the grounding point.

The shielding effect is reduced due to the inductance.

SUMMARY OF THE INVENTION

It is an object of the present invention to provide an antenna arrangement of the type initially cited wherein the shielding effect is improved without the magnetic field components of the radio-frequency shield being degraded.

The above object is achieved in a first embodiment of an antenna arrangement constructed in accordance with the principles of the present invention wherein the shielding elements are flat and extend in the longitudinal direction of the examination space and have large-area connections to the shielding at the face ends of the antenna.

In an alternative embodiment, the flat shielding elements extend in the azimuthal direction and are connected to the shielding at the respective longitudinal edges of the sub-antennas via broad-web, planar conductors, with a free cross-section remaining between adjacent conductors.

As used herein, the description of the shielding elements as "flat" means that they have an expanse comparable to a large ribbon or plate (but need not be precisely rectangular). Referring to the shielding elements as "flat," however, does not preclude the shielding elements from being curved, as needed, to conform to the shape of the examination region.

Short connecting paths between the shielding elements and the outer shielding of the antenna are achieved in both embodiments and, moreover, these connecting paths are large-area (as compared, for example, to wires). The inductance between the shielding elements and the ground thus remains low, so that no disturbing voltage drop, which could degrade the shielding effect, arise.

DESCRIPTION OF THE PREFERRED EMBODIMENTS

Figure 1:
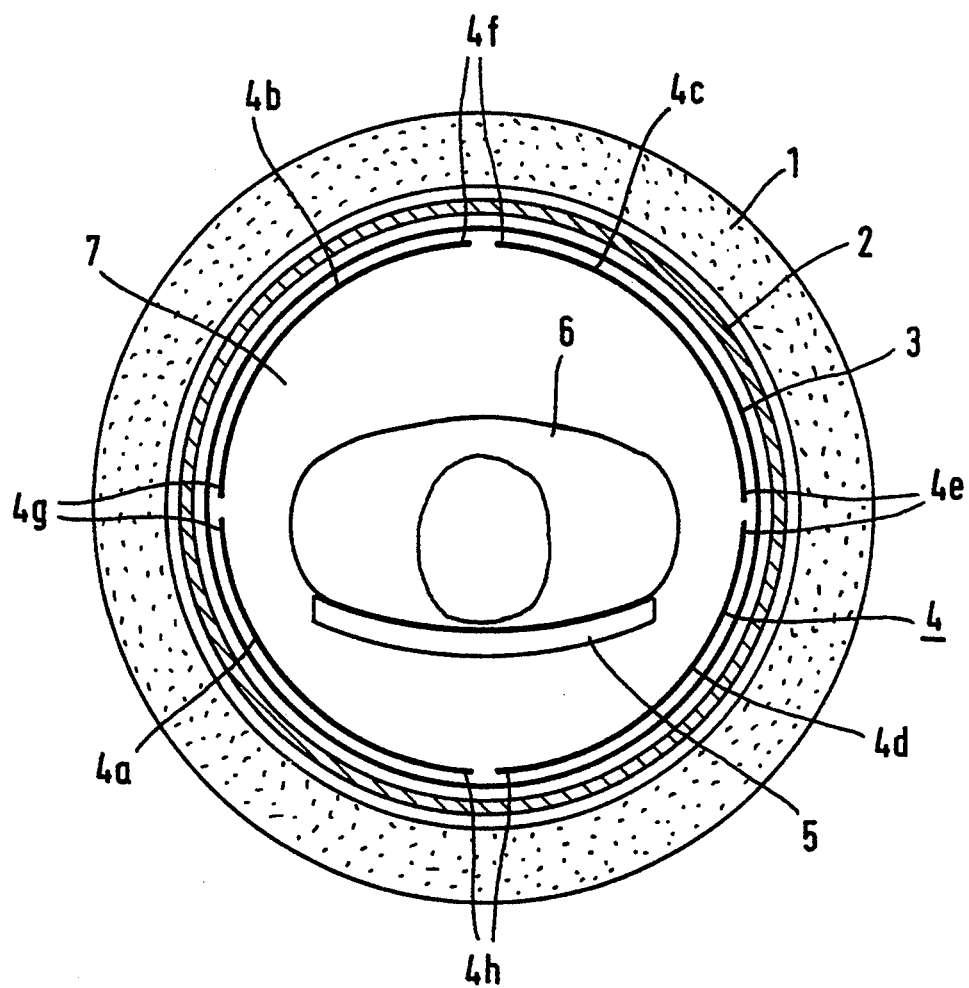
FIG. 1 is a cross-sectional view through a conventional nuclear magnetic resonance tomography apparatus.

FIG. 1 schematically shows a cross section through a nuclear magnetic resonance tomograph apparatus. A magnet 1 that is generally superconductive generates a uniform basic magnetic field in an examination space 7, this basic magnetic field being aligned with the longitudinal direction of the examination space 7, i.e. perpendicular to the plane of the drawing. As a result of this basic magnetic field, the nuclear spins of a subject are aligned in one direction. Nuclear magnetic resonance signals arise by deflecting nuclear spins out of the quiescent position by generating a radio-frequency field having a defined frequency and the radio-frequency signal transmitted when the nuclei relax back into the quiescent position is received. An antenna 4 is required for transmitting and receiving; in the exemplary embodiment, this antenna 4 is composed of four sub-antennas 4a through 4d that are distributed over the circumference of the examination space 7. In order to prevent an emission of radio-frequency toward the outside in the transmission mode, as well as to block disturbing influences on the antenna from the outside in the receiving mode, the antenna 4 is surrounded by a shielding 3. A spatial resolution of the nuclear magnetic resonance signals is achieved by superimposing gradient magnetic fields on the uniform, basic magnetic field so that a spatial dependency of the resonant frequency of the nuclear spins arises. Appropriate gradient coils must therefore be provided, these being arranged in a circular ring 2 and generating linear gradient fields. The gradient fields are switched so that eddy currents can be induced in all conductive parts that are permeated by the gradient field. In order to substantially suppress these eddy currents, all conductive elements are slotted between the examination space 7 and the gradient coils 5 such that the current paths for the eddy currents are interrupted.

Figure 2:
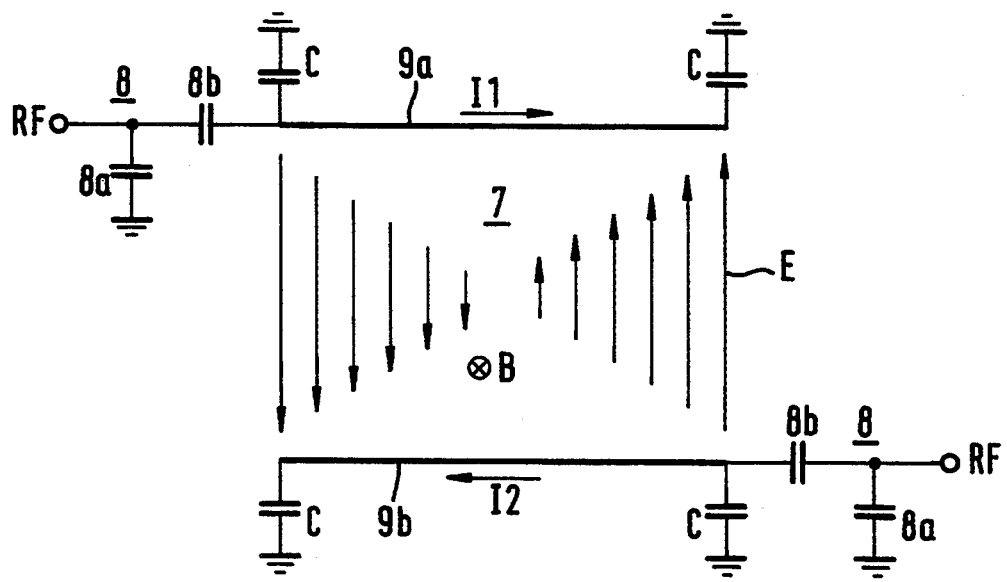
FIG. 2 is a schematic representation of the radio-frequency field as seen in a longitudinal section of the arrangement of FIG. 1.

The field pattern of the radio-frequency field given the arrangement of FIG. 1 is schematically shown in FIG. 2 in longitudinal section. For clarity, the following observations refer to an antenna structure that comprises only two sub-antennas, each of which is composed of a large-area conductor structure 9a at the upper side and, a symmetrical structure 9b at the under side of the examination space 7 that are curved in conformity with the examination space 7. The radio-frequency signal RF is supplied via a matching circuit 8 that is composed of a shunt capacitor 8a connected to ground and a series capacitor 8b. The feed ensues at the two conductor structures 9a and 9b in opposite directions, so that oppositely-directed currents I1 and I2 arise. The conductor structures 9a and 9b have the ends at their long sides connected to ground via capacitors C.

An electromagnetic field that comprises an electrical field component E as well as a magnetic field component B is generated due to the opposite, high-frequency currents I1 and I2. The magnetic field component resides essentially perpendicularly relative to the plane of the drawing in the illustration of FIG. 2.

Figure 3:
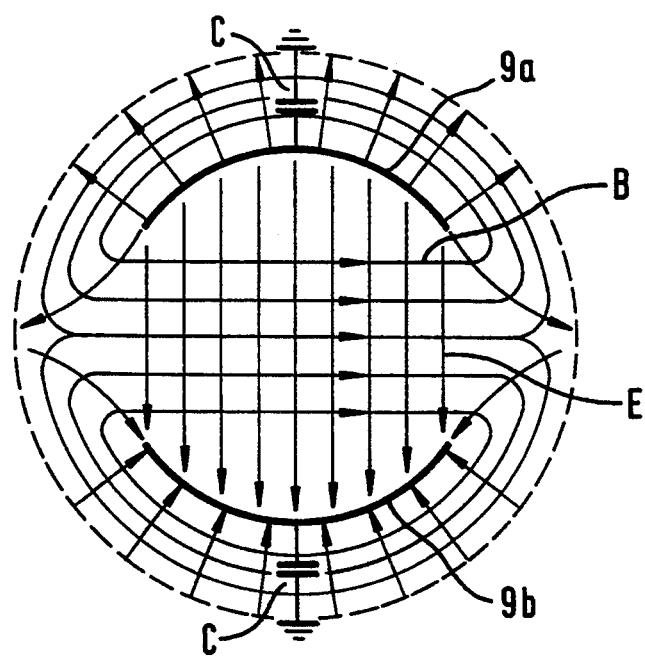
FIG. 3 shows the field pattern of FIG. 2 in cross section.

The field pattern is shown again in cross section in FIG. 3. It can be seen that the magnetic field lines B wrap the conductor structures 9a and 9b, whereas the electrical field lines E proceed between the conductor structures 9a, 9b.

Only the magnetic field component is of use for the nuclear magnetic resonance effect, whereas the electrical field component produces a number of disadvantages. These are essentially:

1) Electrical losses in the patient. These diminish the Q-factor of the antenna and cause heating in the patient that must be taken into consideration when dimensioning the maximally allowed radio-frequency stress.
2) The antenna is detuned upon introduction of the patient into the examination space, so that a balancing dependent on the respective patient is generally required.
3) The electrical fields cause skin-effect waves on lines that extend through or into the examination space.
4) Given circular systems, the sub-antennas are coupled to one another via the electrical fields.

These disadvantageous influences can be at least reduced by shielding the electrical field components of the antenna.

Figure 4:
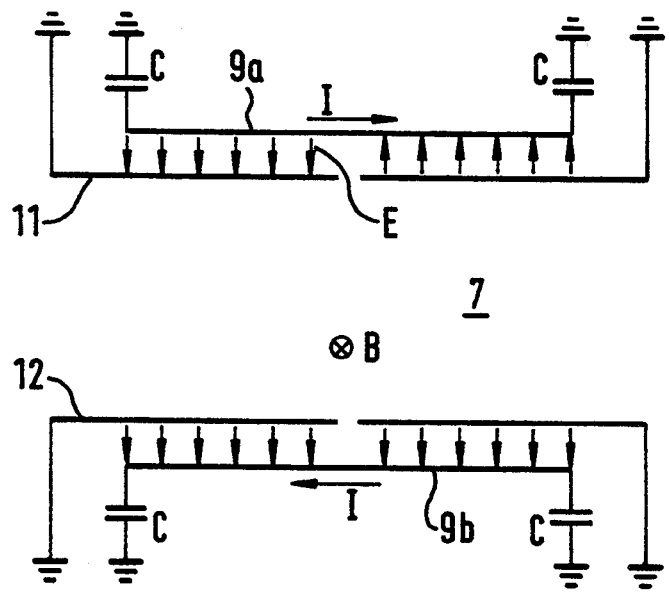
FIG. 4 shows a schematic longitudinal section of a nuclear magnetic resonance imaging apparatus provided with shielding elements in accordance with the principles of the present invention.
Figure 5:
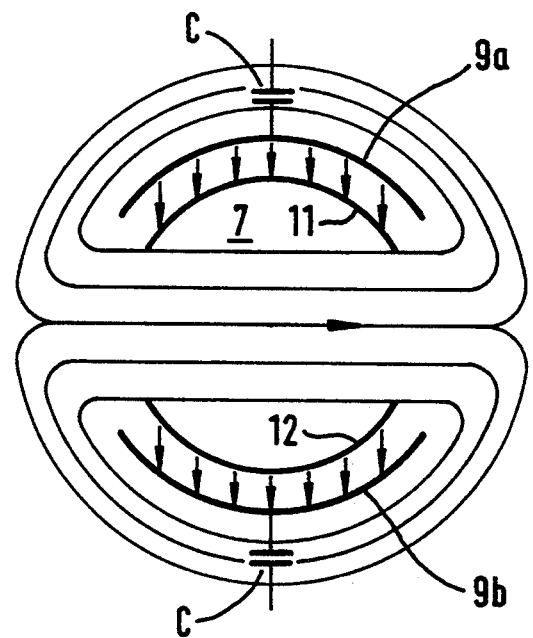
FIG. 5 shows a cross section of the arrangement of FIG. 4.

FIG. 4 (longitudinal section) and FIG. 5 (cross section) show the field patterns of the electrical and of the magnetic field when the conductor structures 9a and 9b are covered with grounded shielding elements 11 and 12. An electrical field E is thereby present almost exclusively in the space between the conductor structures 9a, 9b and the shielding elements 11 and 12. The examination space 7 is largely free of electrical fields. The magnetic field B, however, embraces the conductor elements 9a, 9b and permeates the examination space 7.

Figure 6:
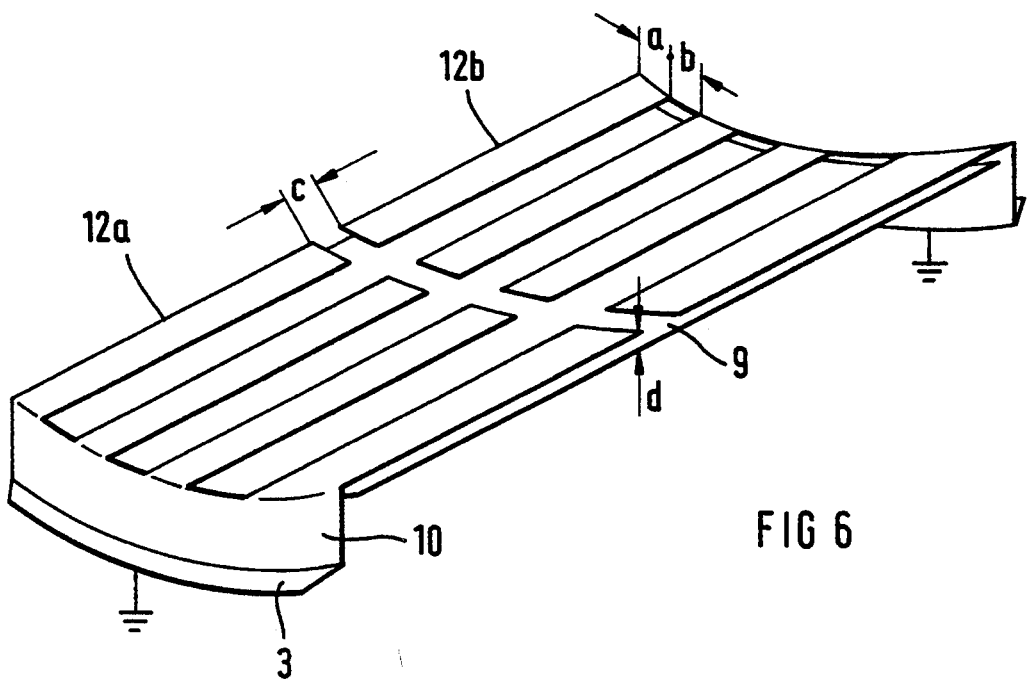
FIG. 6 is a perspective view of a first embodiment of a lower set of shielding elements constructed in accordance with the principles of the present invention.
Figure 7:
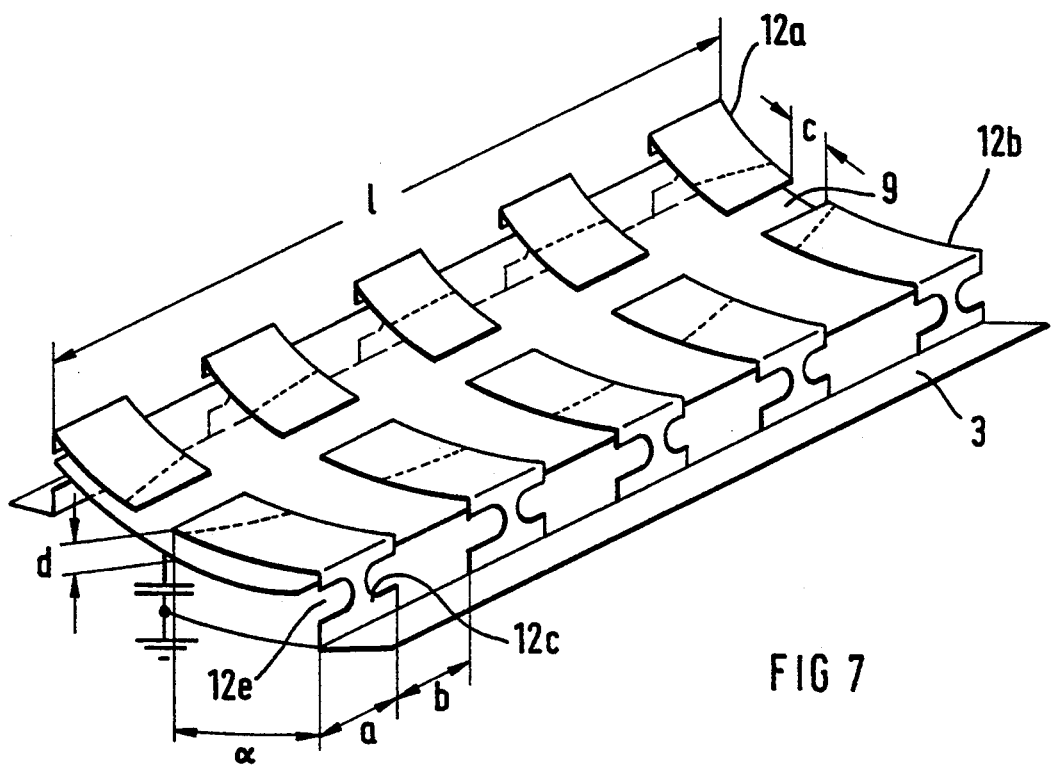
FIG. 7 is a perspective view of a second embodiment of a lower set of shielding elements constructed in accordance with the principles of the present invention.

Two alternatives for the mechanical design of the shielding elements are shown in FIGS. 6 and 7. One shielding element in the embodiment of FIG. 6 is composed of two comb-like structures 12a and 12b having individual lamellae that extend in longitudinal direction of the antenna 9. A gap having the width c remains in the middle of the antenna between the respectively facing lamellae of the shielding element 12a and those of the shielding element 12b. The lamellae of the shielding elements 12a and 12b are connected to the outer shielding 3, and thus to ground, at both end faces via a conductor element 10 that covers the entire width of the shielding elements 12a and 12b.

The following demands are made of the shielding elements 12a and 12b:

1. The magnetic gradient fields should cause optimally few eddy currents in the shielding elements 12a and 12b. This is achieved by the division into individual lamellae and the bi-partition into the shielding elements 12a and 12b.
2. The inductance of the individual lamellae to ground should be optimally low. This is achieved by the large-area form of the lamellae, the large-area connection to ground and the short connecting path to ground.
3. It is especially critical that the magnetic components of the radio-frequency field are not disturbed by eddy currents in the shielding elements. As may be seen in FIG. 5, the magnetic field lines B wrap around the conductor structures 9a and 9b of the antenna at their long sides. It is critical that no conductive parts, or optimally few conductive parts, lie in the region of these field lines, particularly perpendicularly relative to them. In the arrangement of FIG. 6, there are no conductive parts of the shielding that embrace the longitudinal edges of the antenna, so that the magnetic field is not disturbed.
4. The shielding should shield electrical fields as completely as possible. To that end, the spacings b between the individual lamellae and the spacing c between the two halves of the shielding should be corresponding selected.

An optimization of all properties of the antenna is possible by appropriate selection of the lamellae widths a, the spacings b between the lamellae, the spacing c between the two antenna halves, as well as of the spacings d between the shielding 3 and the antenna 4.

In an alternative embodiment according to FIG. 7, the shielding elements 12a and 12b are likewise each executed as a comb-like structure, but the individual lamellae—differing from FIG. 6—do not embrace the conductor structure 9 of the antenna from the end faces, but instead do so from the long side thereof. The shielding elements are again bipartite, whereby a gap having the width c remains between the shielding elements 12a and 12b; by contrast to the embodiment of FIG. 6, the division in the embodiment of FIG. 7 ensues in the longitudinal direction.

In this embodiment, the individual lamellae of the shielding elements 12a and 12b are respectively connected to ground at the end faces. Even shorter line paths and, thus, a lower inductance thus result. The connecting elements 12c between the lamellae 12a, 12b and ground, however, necessarily lie in the region of the magnetic field lines that embrace the long edges. In order to reduce the influence of these connecting elements on the magnetic field due to eddy currents, the lamellae are not connected surface-wide to ground.

Figure 8:
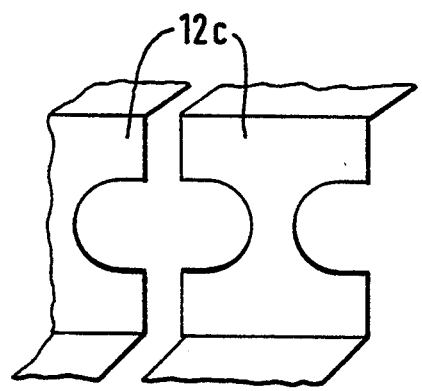
FIGS. 8, 9 and 10 respectively show different embodiments for connecting the shielding elements in the embodiment of FIG. 7 to the overall shielding.
Figure 9:
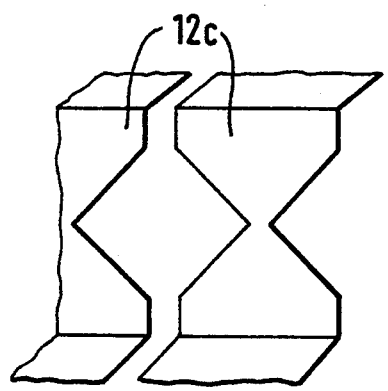
Figure 10:
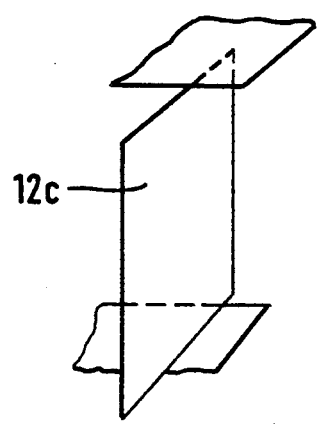

Various possibilities for the connecting elements 12c are shown in FIGS. 8 through 10. In the embodiment of FIG. 8, the connecting elements 12c have semicircular recesses lying opposite one another in the region of the gaps, the magnetic field lines being capable of penetrating through these semicircular recesses. Circular recesses in the connecting elements themselves may at first glance appear to have the disadvantage that a magnetic field penetrating them would cause circular currents around them. This is not possible given the arrangement of FIG. 8, however, since a closed current path does not exist around the circular recesses. The same advantage is also true of the embodiment of FIG. 9, whereby the recesses are triangular. A large-area connecting element 12c between the lamellae and ground is provided in the arrangement of FIG. 10; this, however, is arranged in the direction of the lamellae and, thus, parallel to the magnetic field lines. Since the field lines thus do not penetrate this conductor element, eddy currents are likewise not induced.

The arrangement shown in FIG. 7 also has the advantage that it reduces the electrical field most effectively in the region wherein the patient comes closest to the antenna. It can be seen from FIG. 1 that the patient has the smallest distance from the antenna 4 in the region of the longitudinal edges 4e and 4g of the individual elements of the antenna 4, and is thus most exposed to the electrical fields in that region. The shielding of FIG. 7 is especially effective precisely in the region of the longitudinal edges. Under certain circumstances, a shielding at the longitudinal edges 4f and 4h above and below the patient 6 could also be foregone, since there is a greater spacing from the patient there.

In FIG. 7, the possibility is also indicated in broken lines of making the lamellae 12a and 12b shorter toward the middle of the examination space. This is possible because—as may be seen in FIG. 2—the electrical field E is strongest at the two longitudinal edges of the examination region and becomes weaker toward the middle.

Although modifications and changes may be suggested by those skilled in the art, it is the intention of the inventors to embody within the patent warranted hereon all changes and modifications as reasonably and properly come within the scope of their contribution to the art.

We claim as our invention:

1. A nuclear magnetic resonance tomography apparatus comprising:
   an apparatus part defining an examination space having a circumference and a longitudinal direction extending through a center of said circumference;
   antenna means for transmitting radio-frequency signals into, and for receiving radio-frequency signals from, an examination subject disposed in said examination space, said antenna means being disposed at said circumference of said examination space and extending parallel to said longitudinal direction of said examination space, said antenna means having opposite ends spaced from each other in said longitudinal direction;
   shielding means surrounding said examination space and disposed at said opposite ends for electromagnetically shielding said examination space; and
   a plurality of flat shielding elements extending in said longitudinal direction of said examination space, each shielding element having large area connections to said shielding means at said opposite ends of said antenna means.

2. A nuclear magnetic resonance tomography apparatus as claimed in claim 1 wherein said shielding elements comprise a plurality of opposed shielding elements spaced from each other in a central region of said examination space, and connected to said shielding means at each end face of said antenna means.

3. A nuclear magnetic resonance tomography apparatus comprising:
   an apparatus part defining an examination space having a circumference and a longitudinal direction extending through a center of said circumference;
   antenna means for transmitting radio-frequency signals into, and for receiving radio-frequency signals from, an examination subject disposed in said examination space, said antenna means being disposed at said circumference of said examination space and extending in parallel to said longitudinal direction of said examination space, and said antenna means including a plurality of sub-antennas each having a longitudinal edge parallel to said longitudinal direction;
   shielding means surrounding said examination space for electromagnetically shielding said examination space; and
   a plurality of flat shielding elements disposed in a comb-like pattern extending into said examination space in an azimuthal direction, each shielding element being connected to said shielding means via large area at the longitudinal edge of each sub-antenna, said conductors being disposed with spaces between neighboring conductors.

4. A nuclear magnetic resonance tomography apparatus as claimed in claim 3 wherein each of said conductors has a recess therein facing toward the space between neighboring conductors.

5. A nuclear magnetic resonance tomography apparatus as claimed in claim 3 wherein said conductors are disposed perpendicularly relative to said longitudinal direction of said examination space.

* * * * *